US 8,562,778 B2

(12) United States Patent
Yamada et al.

(10) Patent No.: US 8,562,778 B2
(45) Date of Patent: Oct. 22, 2013

(54) TAPE ADHERING APPARATUS AND TAPE ADHERING METHOD

(75) Inventors: Shingo Yamada, Yamanashi (JP); Kozo Odawara, Osaka (JP)

(73) Assignee: Panasonic Corporation, Osaka (JP)

( * ) Notice: Subject to any disclaimer, the term of this patent is extended or adjusted under 35 U.S.C. 154(b) by 12 days.

(21) Appl. No.: 13/503,701

(22) PCT Filed: Oct. 13, 2011

(86) PCT No.: PCT/JP2011/005744
§ 371 (c)(1),
(2), (4) Date: Apr. 24, 2012

(87) PCT Pub. No.: WO2012/066726
PCT Pub. Date: May 24, 2012

(65) Prior Publication Data
US 2012/0312461 A1  Dec. 13, 2012

(30) Foreign Application Priority Data

Nov. 15, 2010   (JP) ................................. 2010-254688

(51) Int. Cl.
*B32B 38/18*   (2006.01)
*B32B 38/10*   (2006.01)
(52) U.S. Cl.
USPC .......................................... 156/230; 156/510
(58) Field of Classification Search
USPC ................................................ 156/230, 510
IPC ............................................ B32B 38/18,38/10
See application file for complete search history.

(56) References Cited

U.S. PATENT DOCUMENTS

| 4,954,207 | A  | * | 9/1990 | Higuchi et al. | ............... | 156/552 |
| 2004/0069400 | A1 | * | 4/2004 | Onoshiro et al. | ............. | 156/238 |
| 2010/0126654 | A1 | * | 5/2010 | Katayama et al. | ............ | 156/159 |
| 2011/0186235 | A1 | * | 8/2011 | Muraoka et al. | ............... | 156/538 |

FOREIGN PATENT DOCUMENTS

| JP | 2001-294361 A | 10/2001 |
| JP | 2008-060257 A | 3/2008 |
| JP | 2008-242400 A | 10/2008 |
| JP | 2009-283742 A | 12/2009 |
| WO | 2010/084728 A1 | 7/2010 |

OTHER PUBLICATIONS

International Search Report for PCT/JP2011/005744 dated Nov. 8, 2011.

* cited by examiner

*Primary Examiner* — Philip Tucker
*Assistant Examiner* — Shawn F Hogan
(74) *Attorney, Agent, or Firm* — Pearne & Gordon LLP

(57) ABSTRACT

A tape adhering apparatus and a tape adhering method for adhering an ACF tape formed from an anisotropic conductive film to a target adhering area on a substrate are disclosed. It is an objective of the invention to provide a tape adhering apparatus and a tape adhering method that enable shortening of a time consumed by operation for adhering one cut piece of an ACF tape. According to the present invention, the separator is peeled from the cut piece of the ACF tape by letting the tape conveyor means convey the tape member in synchronism with the transfer action of the transfer base and thereafter a cut portion of the ACF tape to be next adhered is placed at the cutting position of the tape cutting means by letting the tape conveyor means continually convey the tape member in the forward conveyance direction.

2 Claims, 7 Drawing Sheets

US 8,562,778 B2

TAPE ADHERING APPARATUS AND TAPE ADHERING METHOD

TECHNICAL FIELD

The present invention relates to a tape adhering apparatus and a tape adhering method for adhering an ACF tape formed from an anisotropic conductive film to a target adhering area on a substrate.

BACKGROUND ART

In the process of manufacture of a module, like a liquid crystal panel, there is employed a tape adhering apparatus that adheres a tape formed from an anisotropic conductive film called an ACF (Anisotropic Conductive Film) (hereinafter referred to as an "ACF tape") to a plurality of electrodes arranged in a row on an upper surface of the substrate. The ACF tape is supplied in the form of a tape member that has a protective tape called a separator set integrally on one side of the tape.

A tape adhering apparatus has a substrate holding unit for holding a substrate; a transfer base that is transferable along a horizontal direction; a press tool provided so as to be vertically movable with respect to the transfer base; tape conveyor means that is disposed on the transfer base and that conveys a tape member forwards and backwards along a direction parallel to the direction of movement of the transfer base within a region immediately below the press tool; tape cutting means for cutting an ACF tape from the tape member conveyed by the tape conveyor means, to thus form a cut piece of the ACF tape on a separator; and transfer rollers that are disposed independently of the transfer base so as to be movable in the horizontal direction and that are moved toward the cut piece of the ACF tape adhered to the target adhering area on the substrate, thereby guiding the transfer base in such a direction as to peel the separator off from the cut piece of the ACF tape (see; for instance, Patent Document 1).

When the cut piece of the ACF tape is adhered to the substrate by such a tape adhering apparatus, processing pertaining to a train of operations, such as those mentioned below, is iterated. The operations include (1) a process for positioning the transfer base in such a way that one end of the press tool comes to a position immediately above one end of the target adhering area including electrodes on the substrate; (2) a process for conveying the tape member in such a way that a front end of the ACF tape is situated in an area below the press tool and that the cut portion of the ACF tape comes to a position immediately above the one end of the target adhering area; (3) a process for cutting the ACF tape by the tape cutting means advanced to the cut portion of the ACF tape located immediately below the press tool, thereby forming a cut piece of the ACF tape on the separator; (4) a process for lowering the press tool and pressing the cut piece of the ACF tape against the target adhering area on the substrate, thereby adhering the cut piece of the ACF tape to the target adhering area; (5) a process for moving the transfer rollers toward the cut piece of the ACE tape adhered to the target adhering area on the substrate, to thus peel the separator off from the cut piece of the ACF tape, and returning the transfer rollers to their original positions; and (6) a process for moving the transfer base in such a way that the press tool comes to a position above the target adhering area on the substrate where the cut piece of the ACF tape is to be adhered.

RELATED ART DOCUMENT

Patent Document

Patent Document 1: JP-A-2001-294361

SUMMARY OF THE INVENTION

Problem that the Invention is to Solve

However, as mentioned above, the related-art tape adhering apparatus presses the ACF tape against the target adhering area on the substrate by the press tool, to thus adhere the tape to the area, and subsequently peels the separator from the cut piece of the ACF tape adhered to the substrate before transferring the transfer base in such a way that the press tool comes to a position above the target adhering area on the substrate where the cut piece of the ACF tape is to be adhered. To this end, the related-art tape adhering apparatus must reciprocally actuate the transfer rollers with respect to the transfer base (equivalent to process (5)), which makes a mechanism complicate. Moreover, the related-art tape adhering apparatus has another problem of an increase in time consumed in carrying out operation for adhering the ACF tape per cut piece. The tape cutting means for cutting the ACF tape has hitherto been caused to advance to a position immediately below the press tool when cutting the ACF tape. However, when the cut piece of the ACF tape is adhered to the target adhering area on the substrate by the press tool, the tape cutting means is to be withdrawn so as not to interfere in the press tool. For this reason, the related art tape cutting means also involve consumption of time to let the tape cutting means advance or recede.

An objective of the present invention is to provide a tape adhering apparatus and a tape adhering method that enable shortening of a time consumed in adhering operation per cut piece of an ACF tape.

Means for Solving the Problem

In one mode of the present invention, a tape adhering apparatus comprises a substrate holding unit that holds a substrate; a transfer base that is movable in a horizontal direction; a press tool disposed so as to be able to ascend or descend with respect to the transfer base; tape conveyor means that is disposed on the transfer base and that transfers a tape member, which is formed by putting a separator on one side of an ACF tape made up of an anisotropic conductive film, in a forward or backward direction along a direction parallel to a transfer direction of the transfer base in a region immediately below the press tool; tape cutting means that is disposed downstream of the region of, immediately below the press tool, the tape member conveyed by the tape conveyor means with respect to the forward transfer direction of the tape member and that cuts the ACF tape from the tape member conveyed by the tape conveyor means, thereby forming a cut piece of the ACF tape on the separator; tool elevation means that lowers the press tool while positioned at a location immediately above a target adhering area on the substrate, where a cut piece of the ACF tape formed on the separator is held by the substrate holding unit, as a result of the tape member being conveyed in a reverse direction by the tape conveyor means, thereby pressing the cut piece of the ACF tape to the target adhering area on the substrate and adhering the cut piece of the ACF tape to the target adhering area; and transfer base actuation means that transfers the transfer base with respect to the substrate holding unit in a direction opposite to the forward transfer direction of the tape member in the region immediately below the press tool in such a way that the press tool comes to an elevated position above the target adhering area on the substrate where the cut piece of the ACF tape is then adhered after the cut piece of the ACF tape is pressed against and adhered to the target adhering area on the substrate by the press tool. The tape conveyor means forwardly conveys the tape member in synchronism with actuation of the transfer base performed by the transfer base actuation means, thereby peeling the separator off from the cut piece of the ACF tape adhered to the target adhering area on the substrate, and further keeps conveying the tape member forwards, to thus place a cut portion of the ACF tape to be adhered next to the cutting position of the tape cutting means.

In another mode of the present invention, a tape adhering method is for a tape adhering apparatus including a substrate holding unit that holds a substrate; a transfer base that is movable in a horizontal direction; a press tool disposed so as to be able to ascend or descend with respect to the transfer base; tape conveyor means that is disposed on the transfer base and that transfers a tape member, which is formed by putting a separator on one side of an ACF tape made up of an anisotropic conductive film, in a forward or backward direction along a direction parallel to a transfer direction of the transfer base in a region immediately below the press tool; and tape cutting means that is disposed downstream of the region of, immediately below the press tool, of the tape member conveyed by the tape conveyor means with respect to the forward transfer direction of the tape member and that cuts the ACF tape from the tape member conveyed by the tape conveyor means, thereby forming a cut piece of the ACF tape on the separator. The method comprises a process of cutting, by use of tape cutting means, an ACF tape from a tape member conveyed by tape conveyor means, thereby forming a cut piece of the ACF tape on a separator; a process of conveying the tape member in the reverse direction by the tape conveyor means, thereby placing the cut piece of the ACF tape formed on the separator at a position immediately above a target adhering area on the substrate held by the substrate holding unit; a process of lowering the press tool while the cut piece of the ACF tape formed on the separator is kept positioned immediately above the target adhering area on the substrate, thereby pressing the cut piece of the ACF tape against the target adhering area on the substrate and adhering the cut piece of the ACF tape to the target adhering area; a process of next transferring the transfer base, with respect to the substrate holding unit, in a direction opposite to the forward transfer direction of the tape member in the region immediately below the press tool in such a way that the press tool comes to a position above the target adhering area on the substrate to which the cut piece of the ACF tape is to be adhered after the cut piece of the ACF tape is pressed against and adhered to the target adhering area on the substrate by the press tool, and letting the tape conveyor means convey the tape member in synchronism with transfer action of the transfer base, to thus peel the separator from the cut piece of the ACF tape adhered to the target adhering area on the substrate; and a process of peeling the separator from the cut piece of the ACF tape and letting the tape conveyor means continually convey the tape member in the forward conveyance direction, thereby placing a cut portion of the ACF tape to be next adhered at the cutting position of the tape cutting means.

Advantages of the Invention

In the present invention, the press tool presses and adheres the cut piece of the ACF tape against and to the target adhering area on the substrate. Subsequently, the tape member is forwardly conveyed in synchronism with actuation of the transfer base in such a way that the press tool comes to an elevated position above the target adhering area on the substrate to which the cut piece of the ACF tape is to be adhered, thereby peeling the separator from the cut piece of the ACF tape. Next, there are simultaneously performed processing pertaining to the process (process (5)) of peeling the separator from the cut piece of the ACF tape adhered to the target adhering area on the substrate and processing pertaining to the process (process (6)) of placing the press tool at an elevated position above the target adhering area on the substrate to which the cut piece of the ACF tape is to be adhered. Hence, a necessity for additionally providing transfer rollers for peeling the separator and reciprocally actuating the transfer rollers, such as that required in the related art, becomes obviated. Further, a time consumed by operation for adhering one cut piece of the ACF tape can be shortened.

The tape cutting means is disposed downstream of the region of, immediately below the press tool, of the tape member conveyed by the tape conveyor means with respect to the forward transfer direction of the tape member. Hence, occurrence of interference with the press tool, which would otherwise arise when the cut piece of the ACF tape is pressed against the substrate, is prevented. Therefore, a necessity for a configuration that allows advancement and receding of the tape cutting means becomes obviated. The mechanism of the tape adhering apparatus therefore becomes simple. Further, the time consumed by letting the tape cutting means advance and recede every time the ACF tape is cut is omitted. Hence, the time consumed by operation for adhering one cut piece of the ACF tape can be shortened even in view of this aspect. Since positioning of a cut position of the ACF tape can be performed by carrying out, without involvement of a change and interruption, forward conveyance of the tape member for peeling the separator, a work time will not increase when compared with the case where the cut position of the ACF tape of the tape member is positioned at a cutting position immediately below the press tool and where the tape cutting means is caused to advance to cut the ACF tape, such as those performed in the related art.

EMBODIMENT FOR IMPLEMENTING THE INVENTION

Figure 1:
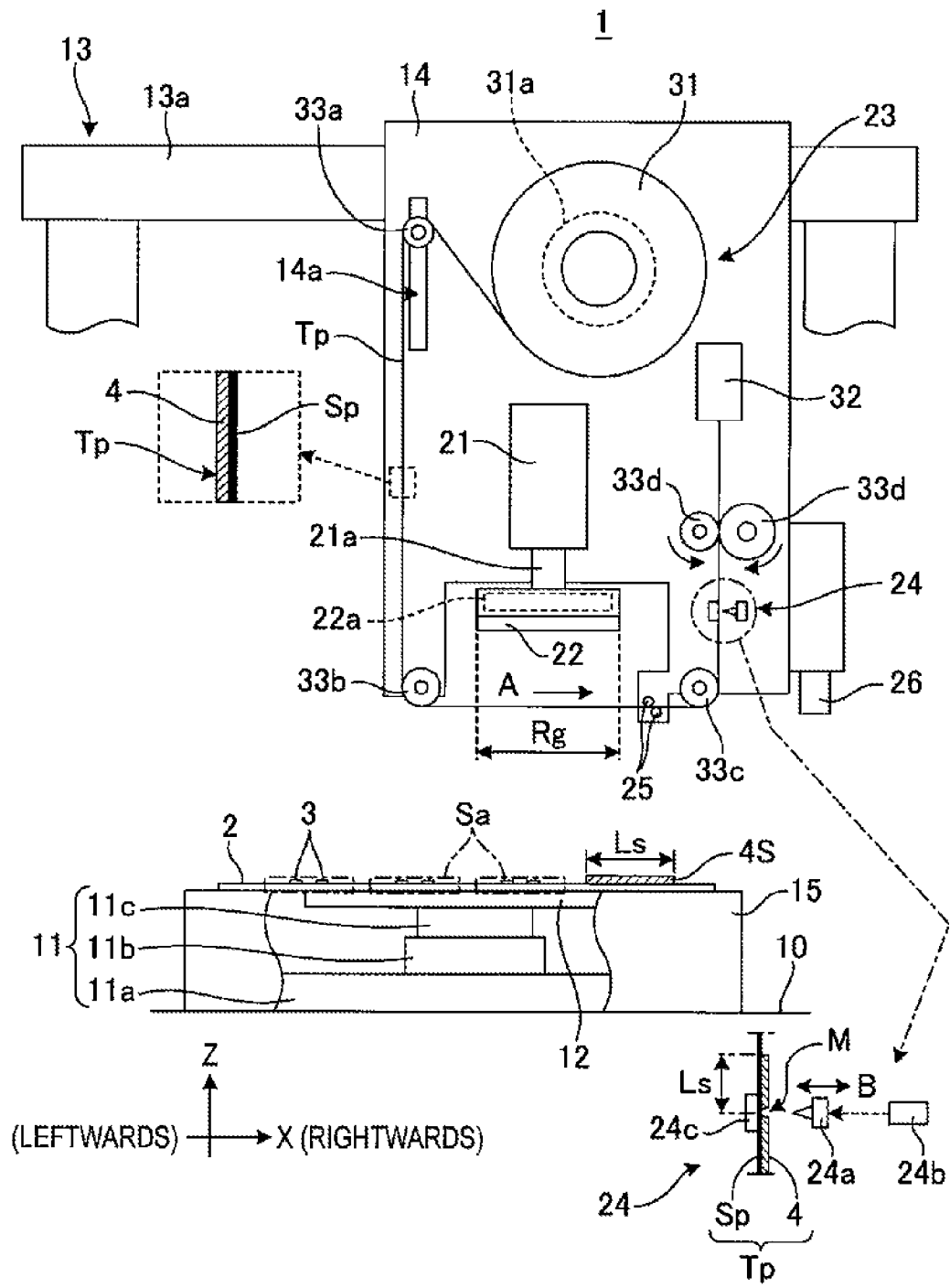
FIG. 1 is a front view of a tape adhering apparatus of an embodiment of the present invention.

An embodiment of the present invention is hereunder described by reference to the drawings. A tape adhering apparatus 1 shown in FIGS. 1 and 2 makes up a liquid crystal panel manufacturing line in conjunction with electrode cleaning equipment disposed at an upstream position and a tentative bonder and a principal pressure bonder, and the like, disposed at downstream positions. After receiving a substrate 2 as a liquid crystal panel substrate from the electrode cleaning equipment placed at the upstream position, the tape adhering apparatus 1 adheres a cut piece 4S of a tape (an ACF tape 4) formed from an anisotropic conductive film called an ACF (Anisotropic Conductive Film) to each of a plurality of electrodes 3 provided along an edge of an upper surface of the substrate 2. Subsequently, the tape adhering apparatus 1 delivers the substrate 2 to the tentative pressure bonder disposed at the downstream position. In the present embodiment, the ACF tape 4 is supplied as a tape member Tp on one side of which a separator Sp serving as a protective tape is pasted (see an enlarged view in FIG. 1).

Figure 2:
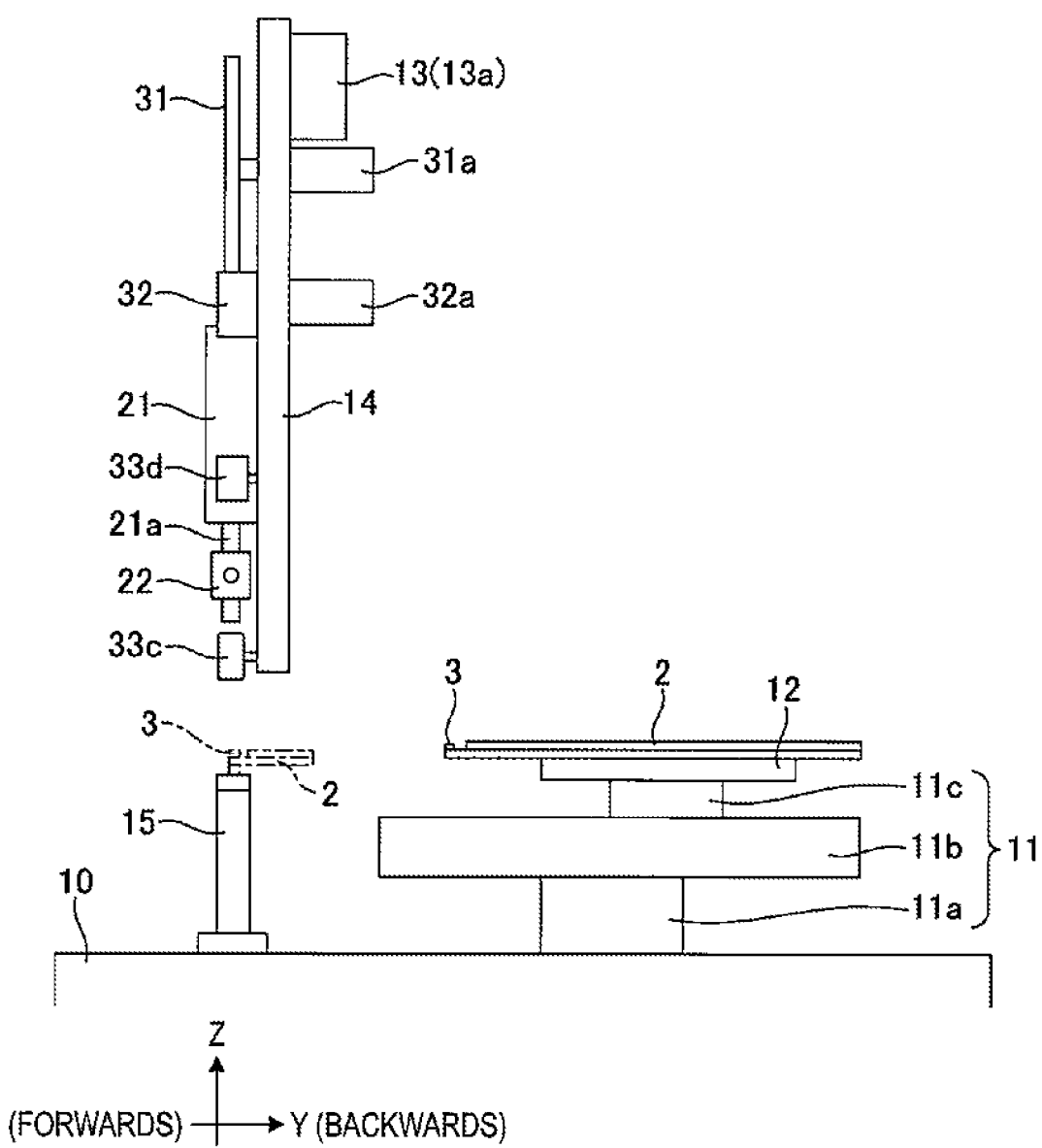
FIG. 2 is a side view of the tape adhering apparatus of the embodiment of the present invention.

In FIGS. 1 and 2, the tape adhering apparatus 1 includes a base 10; a table-shaped substrate holding unit 12 that holds the substrate 2 in a horizontal position in such a way that the electrodes 3 are upwardly oriented and that is transferred by a substrate holding unit transfer mechanism 11 placed on the base 10; a portal frame 13 that is disposed on the base 10 and that has a transverse frame 13a extending in a horizontal direction; a plate-like transfer base 14 that is placed at an elevated position above the substrate holding unit 12 while attached to the transverse frame 13a of the portal frame 13 so as to be movable along the transverse frame 13a (i.e., in the horizontal direction); and a backup stage 15 disposed on the base 10 so as to extend in a direction of transfer of the transfer base 14.

For the convenience of explanation, a horizontal direction along which the transverse frame 13a extends (i.e., the transfer base 14 is transferred) is taken as a right-left direction of the tape adhering apparatus 1 and referred to as an X-axis direction. Another horizontal direction orthogonal to the X-axis direction is taken as a front-back direction of the tape adhering apparatus 1 and referred to as a Y-axis direction. The vertical direction is taken as a Z-axis direction. Further, of right and left directions (i.e., directions oriented along the X-axis direction), a left direction is assigned to a left side of a drawing sheet of FIG. 1, and a right direction is assigned to a right side of the drawing sheet of FIG. 1. Of front and back directions (i.e., directions oriented along the Y-axis direction), a forward direction is assigned to a left side of a drawing sheet of FIG. 2, and a backward direction is assigned to a right side of the drawing sheet of FIG. 2.

In FIGS. 1 and 2, the substrate holding unit transfer mechanism 11 is made up of an X-axis table 11a that is movable in the right-left direction (the X-axis direction) with respect to the base 10, a Y-axis table 11b that is movable in the front-back direction (the Y-axis direction) with respect to the X-axis table 11a, and a θ table 11c that is attached to the Y-axis table 11b and that is rotatable around the Z axis. The substrate holding unit 12 is attached to an upper surface of the θ table 11c. The substrate holding unit 12 can be transferred within a horizontal plane by transfer of the X-axis table 11a in the right-left direction (the X-axis direction), transfer of the Y-axis table 11b in the front-back direction (the Y-axis direction), and rotation of the θ table 11c around the up-down direction (the Z axis).

In FIGS. 1 and 2, a tool elevation cylinder 21, a press tool 22 that is vertically movable with respect to the transfer base 14 by the tool elevation cylinder 21, a tape conveyor unit 23, a tape cutting unit 24, peeling rollers 25, and an imaging camera 26 are provided on a front surface of the transfer base 14.

In FIGS. 1 and 2, the tool elevation cylinder 21 is disposed at a front center of the transfer base 14 while the piston rod 21a is oriented downwards. The press tool 22 is attached to a lower end of the piston rod 21a. The piston rod 21a of the tool elevation cylinder 21 is caused to project downwardly, whereupon the press tool 22 ascends and descends between an elevated position shown in FIG. 1 and a lowered position right below the elevated position. A heater 22a (FIG. 1) that heats the press tool 22 is provided in the press tool 22.

In FIGS. 1 and 2, the tape conveyor unit 23 is made up of a feed reel 31 that feeds a tape member Tp, a tape recovery unit 32 that recovers the tape member Tp supplied from the feed reel 31 by vacuum suction, and a plurality of guide rollers that guide the tape member Tp from the feed reel 31 to the tape recovery unit 32 (a first guide roller 33a, a second guide roller 33b, a third guide roller 33c, and a pair of fourth guide rollers 33d). The feed reel 31 is driven by a feed reel drive motor 31a disposed on a back of the transfer base 14. Likewise, the tape recovery unit 32 is driven by a tape recovery unit actuation mechanism 32a disposed on the back of the transfer base 14.

In FIG. 1, the first guide roller 33a is movable within a roller transfer groove 14a formed in an upper left portion of the transfer base 14 so as to extend in a vertical direction, and remains forced upwardly by an un-illustrated force member. The second guide roller 33b is disposed in a lower left portion of the transfer base 14 and below the first guide roller 33a. The third guide roller 33c is positioned on the right side of the second guide roller 33b and in a lower right portion of the transfer base 14. The pair of fourth guide rollers 33d are placed above the third guide roller 33c and side by side at a right center area of the transfer base 14 along the right-left direction. When the press tool 22 is at the elevated position, the second guide roller 33b and the third guide roller 33c are situated at a position below a lower surface of the press tool 22 (see FIG. 1). When the press tool 22 is situated at the lowered position, the second guide roller 33b and the third guide roller 33c are disposed at a position above the lower surface of the press tool 22.

In FIG. 1, the tape member Tp supplied from the feed reel 31 is guided by, in this sequence, the first guide roller 33a, the second guide roller 33b, the third guide roller 33c, and the pair of fourth guide rollers 33d (both surfaces of the tape member Tp are nipped, from both sides, between the pair of fourth guide rollers 33d) and delivered to the tape recovery unit 32.

Appropriate tension is imparted to the tape member Tp as a result of the first guide roller 33a being forced upwardly within the roller transfer groove 14a. Between the first guide roller 33a and the second guide roller 33b is held the tape member Tp in an attitude such that the tape is stretched in the vertical direction within the left area of the transfer base 14. In contrast, between the second guide roller 33b and the third guide roller 33c is held the tape member Tp in an attitude such that the tape is stretched in a right-left direction (the X-axis direction) within a lower area of the transfer base 14 (when the press tool 22 is situated at the elevated position). Moreover, the tape member Tp is held within the right area of the transfer base 14, while stretched in the vertical direction, between the third guide roller 33c and the pair of fourth guide rollers 33d and between the pair of fourth guide rollers 33d and the tape recovery unit 32.

The tape transfer unit 23 feeds the tape member Tp from the feed reel 31 while attracting the tape member Tp by suction by the tape recovery unit 32, so that the tape member Tp can be conveyed in a forward direction (a direction along which the tape travels from left to right in a region Rg immediately below the press tool 22 and which is designated by arrow A shown in FIG. 1). The feed reel 31 takes up the tape member Tp while the tape recovery unit 32 is attracting the tape member Tp by suction, whereby the tape member Tp can be conveyed in an opposite direction (a direction from right to left in the region Rg located immediately below the press tool 22).

In the embodiment, the tape conveyor unit 23 is provided on the transfer base 14. The tape conveyor unit 23 acts as tape conveyor means that conveys the tape member Tp forward and backward in a direction parallel to the transfer direction (the X-axis direction) of the transfer base 14 in the region Rg located immediately below the press tool 22.

The tape cutting unit 24 is situated at a position on the tape member Tp between the third guide roller 33c and the pair of fourth guide rollers 33d that is downstream of the region Rg of, immediately below the press tool 22, the tape member Tp conveyed by the tape conveyor unit 23. The tape cutting unit 24 is made up of a cutter 24a that is disposed so as to be movable in the right-left direction (i.e., a direction orthogonal to a surface of the tape member Tp) in the right region of the tape member Tp extending in the vertical direction between the third guide roller 33c and the pair of fourth guide rollers 33d; a cutter drive cylinder 24b that drives the cutter 24a in such a way that the cutter 24a is transferred between a housing position on the right side and a projecting position on the left side (designated by arrow B shown in FIG. 1); and a backboard 24c that is disposed opposite the cutter 24a in the horizontal direction (i.e., a position opposite to the cutter 24a with the tape member Tp sandwiched therebetween) in the left area of the tape member Tp extending in the vertical direction between the third guide roller 33c and the pair of fourth guide rollers 33d.

In the tape cutting unit 24, clearance equal to the thickness of the separator Sp is secured between the cuter 24a situated at the projecting position and the backboard 24c. Therefore, when the cutter 24s is transferred from the housing position to the projecting position by the cutter drive cylinder 24b while the tape member Tp remains extended in the vertical direction between the third guide roller 33c and the pair of fourth guide rollers 33d, the cutter 24a is pressed against, at right angles to, the ACF tape 4 on the right surface of the tape member Tp. Only the ACF tape 4 is thereby cut from the tape member Tp. The backboard plate 24c acts, at this time, as a stiffening plate that supports the separator Sp on the left surface of the tape member Tp, to thus generate reactive force against a pressing load of the cutter 24a on the tape member Tp.

In FIG. 1, the ACF tape 4 on the right surface of the tape member Tp extending in the vertical direction between the third guide roller 33c and the pair of fourth guide rollers 33d is cut by the tape cutting unit 24 while the head of the tape is pulled up, by a length Ls, with reference to a cutting position M that is a position (a height) at which the cutter 24a travels right and left. The length Ls corresponds to a length of a target adhering area Sa (a plurality of electrodes 3 exist within each of the target adhering areas Sa in FIG. 1) on the substrate 2, where an attempt is made to adhere the ACF tape 4 to the electrodes 3, in the X-axis direction. The ACF tape 4 is cut by the cutting unit 24, whereby the cut piece 4S of the ACE tape 4 having the length Ls is formed on the separator Sp.

Specifically, in the present embodiment, the tape cutting unit 24 is disposed downstream of the region Rg of, immediately below the press tool 22, the tape member Tp conveyed by the tape conveyor unit 23 with respect to the forward transfer direction of the tape member Tp. The tape cutting unit 24 acts as tape cutting means that cuts the ACF tape 4 from the tape member Tp conveyed by the tape conveyor unit 23, to thus form the cut piece 4S of the ACF tape 4 on the separator Sp.

In FIG. 1, the peeling rollers 25 are made up of a pair of roller members that vertically nip a downstream portion (a portion of the right side of the region Rg, immediately below the press tool 22, of the tape member Tp conveyed by the tape conveyor unit 23) with respect to the forward transfer direction of the tape member Tp than the region Rg located immediately below the press tool 22 of the tape member Tp conveyed by the tape conveyor unit 23. The peeling rollers 25 are provided on the transfer base 14. When the transfer base 14 is moved in the horizontal direction, the peeling rollers 25 are also transferred along with the transfer base 14 in the horizontal direction.

The imaging camera 26 is mounted on a lower right side of the transfer base 14 with an imaging field of view of the camera oriented downward. The imaging camera 26 travels along with horizontal transfer of the transfer base 14 and captures images of positioning marks (not shown) provided on both right and left ends of the substrate 2 held by the substrate holding unit 12.

An operation performance control unit 40a of the controller 40 (FIG. 3) installed in the tape adhering apparatus 1 controls operation of a transfer base actuation mechanism 41 (FIG. 3) made up of an un-illustrated actuator, or the like, whereby the transfer base 14 travels in the X-axis direction (the right-left direction) with respect to the transverse frame 13a of the portal frame 13.

The operation performance control unit 40a of the controller 40 controls operation of a substrate holding unit actuation mechanism 42 made up of an un-illustrated actuator, or the like, (FIG. 3), whereby the substrate 2 held by the substrate holding unit 12 travels.

Figure 3:
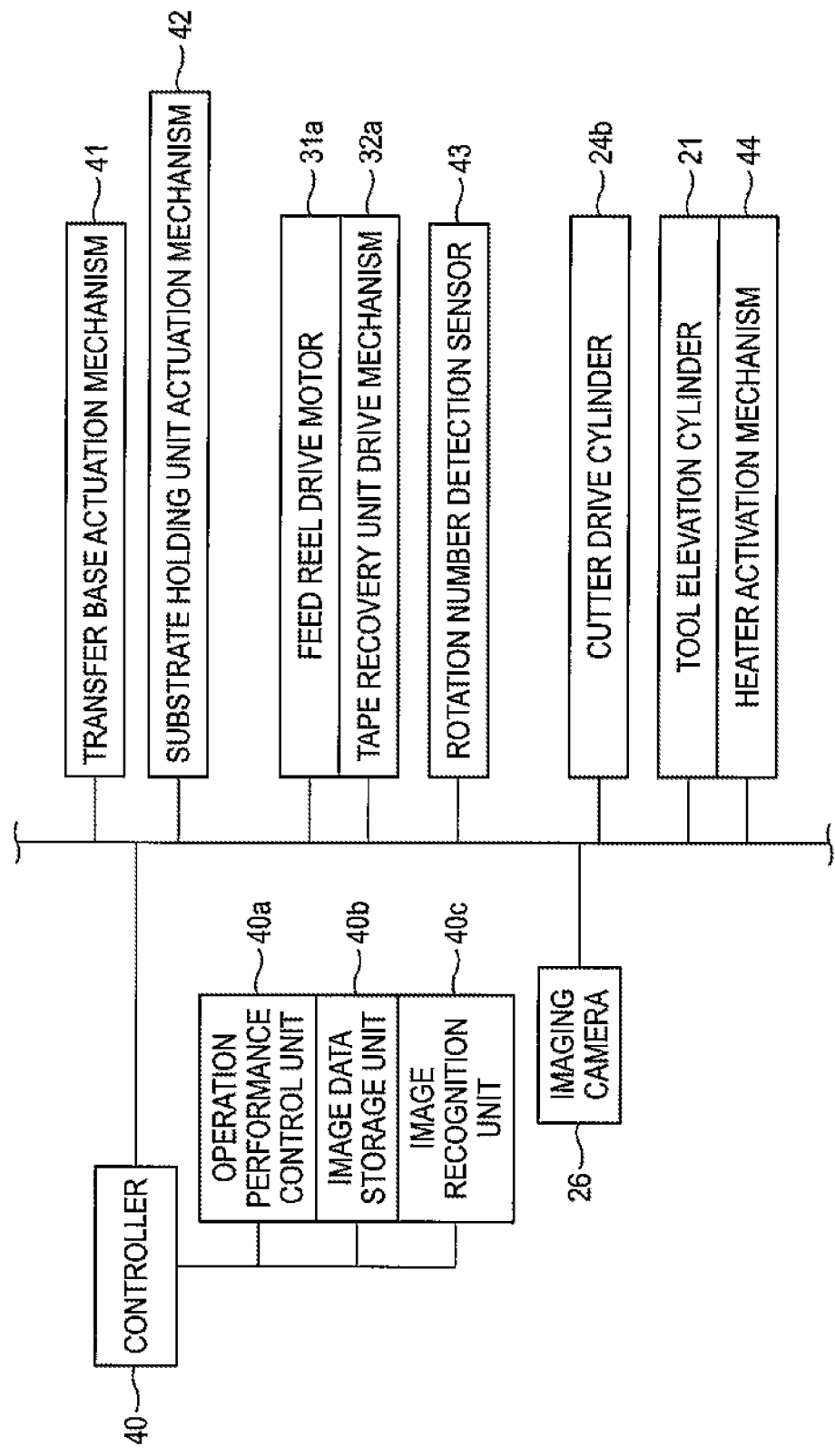
FIG. 3 is a unit diagram showing a control system of the tape adhering apparatus of the embodiment of the present invention.

The operation performance control unit 40a of the controller 40 controls operation of the feed reel drive motor 31a and operation of the tape recovery unit actuation mechanism 32a, whereby the tape conveyor unit 23 conveys the tape member Tp (FIG. 3).

The head position of the ACF tape 4 of the tape member Tp is calculated from information about the number of rotations of the one fourth guide roller 33d detected by a rotation number detection sensor 43 (FIG. 3), data pertaining to a radius of the one fourth guide roller 33d, and the like. Moreover, the operation performance control unit 40a of the controller 40 controls operation of the cutter drive cylinder 24b, whereby the cutter 24a of the tape cutting unit 24 travels right and left; namely, the cutter 24a cuts the ACF tape 4 (FIG. 3).

The operation performance control unit 40a of the controller 40 controls operation of the tool elevation cylinder 21, whereby the press tool 22 is vertically actuated (FIG. 3). The operation performance control unit 40a of the controller 40 controls operation of a heater activation mechanism 44 (FIG. 3), whereby the heater 22a provided in the press tool 22 heats the press tool 22.

The operation performance control unit 40a of the controller 40 controls imaging operation of the imaging camera 26 (FIG. 3). Image data captured by the imaging camera 26 are stored in an image data storage unit 40b of the controller 40. An image recognition unit 40c (FIG. 3) received a command from the operation performance control unit 40a performs image recognition on the basis of the image data stored in the image data storage unit 40b.

Figure 4:
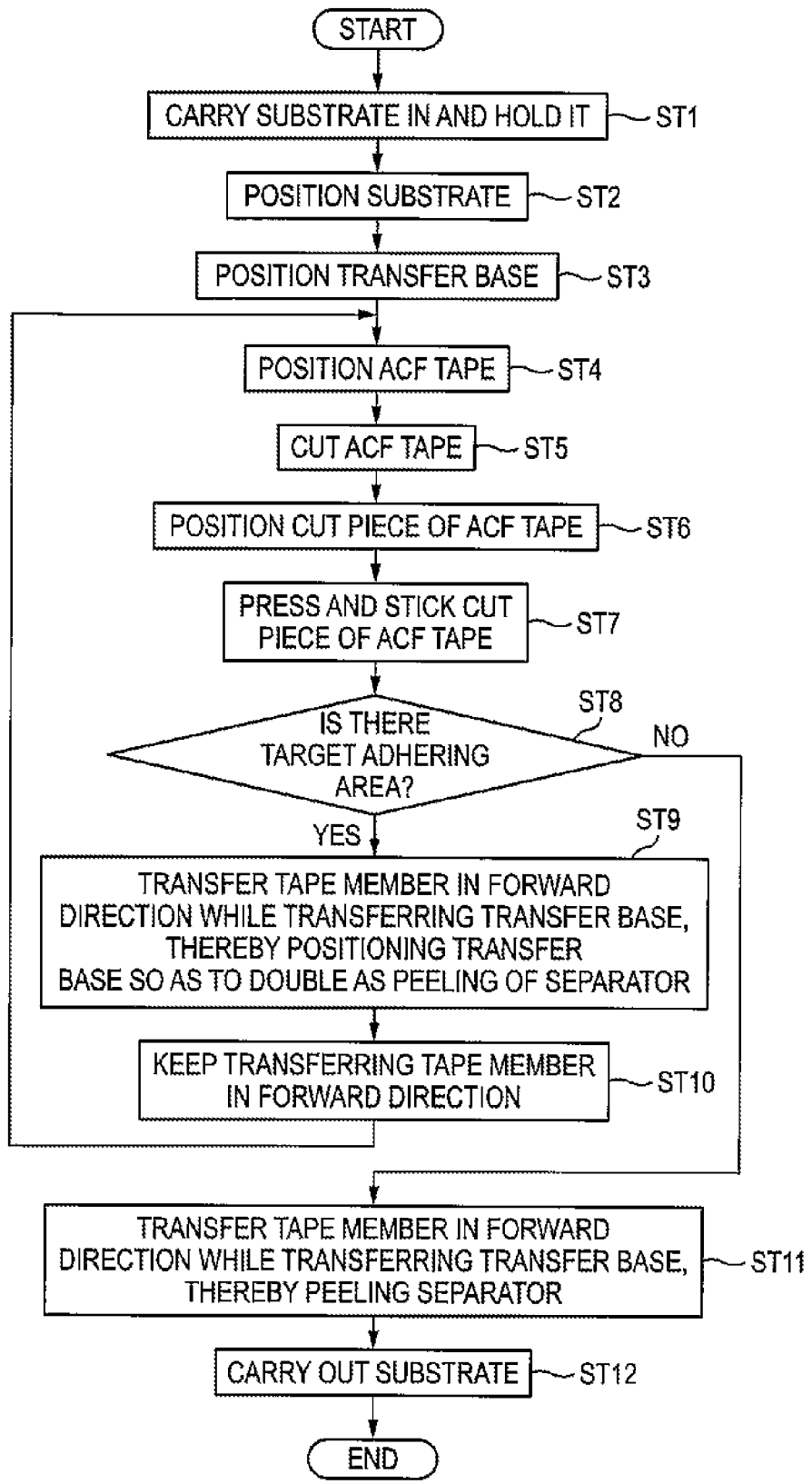
FIG. 4 is a flowchart showing procedures of operation in which the tape adhering apparatus of the embodiment of the present invention adheres a cut piece of an ACF tape to a target adhering area on a substrate.
Figure 5:
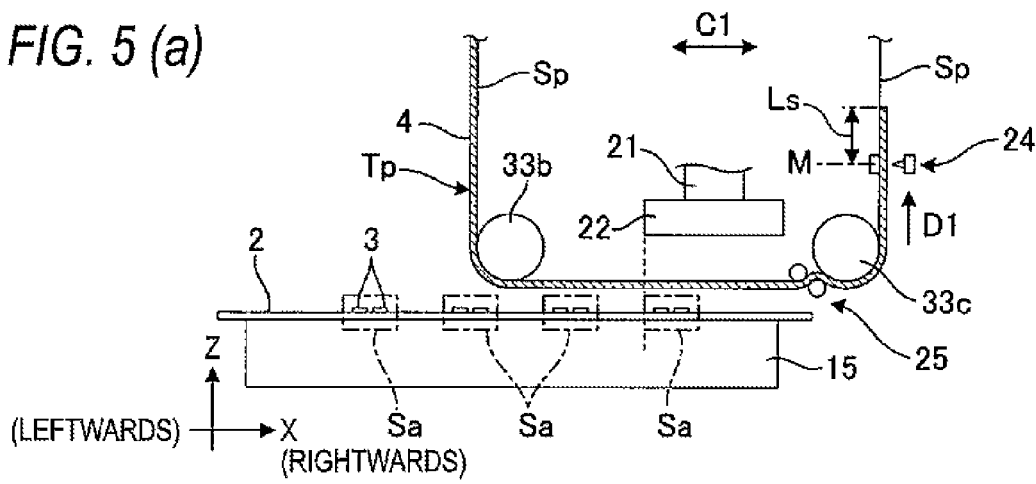
FIGS. 5 (a), (b), and (c) are descriptive operation diagrams of tape adhering operation performed by the tape adhering apparatus of the embodiment of the present invention.
Figure 5:
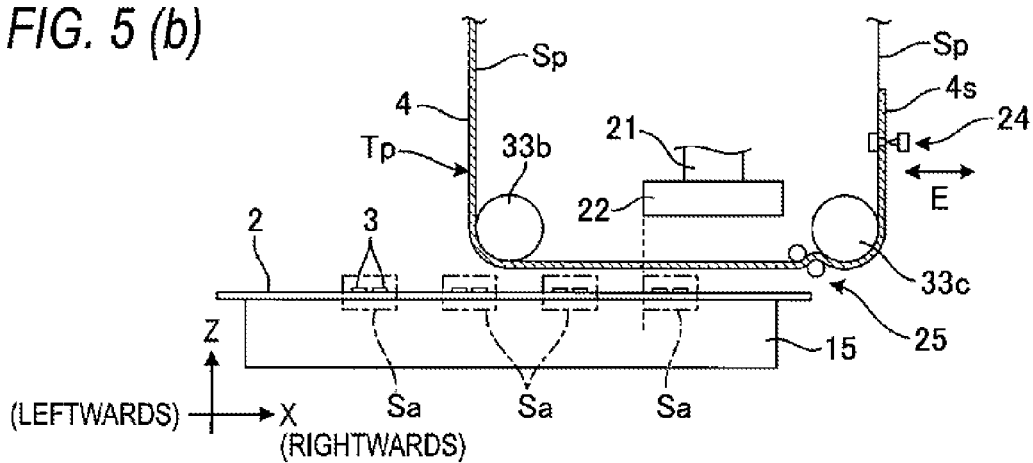
Figure 5:
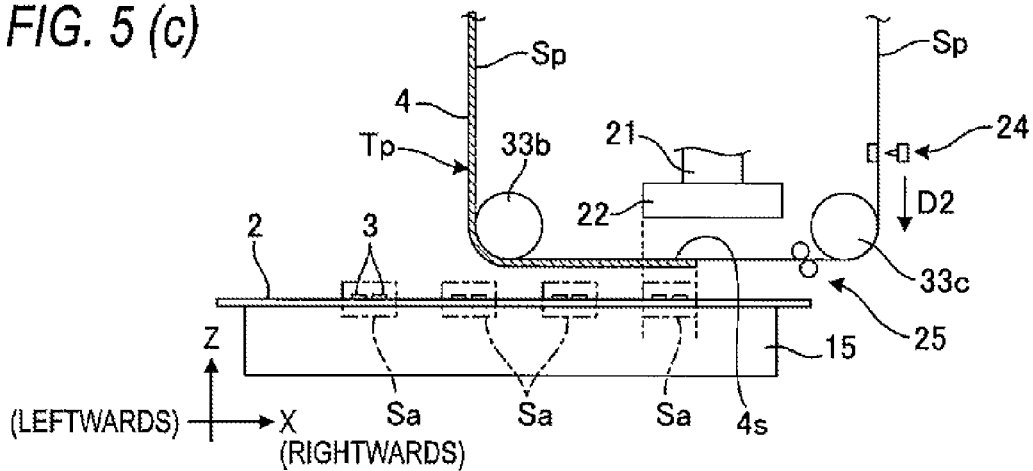
Figure 6:
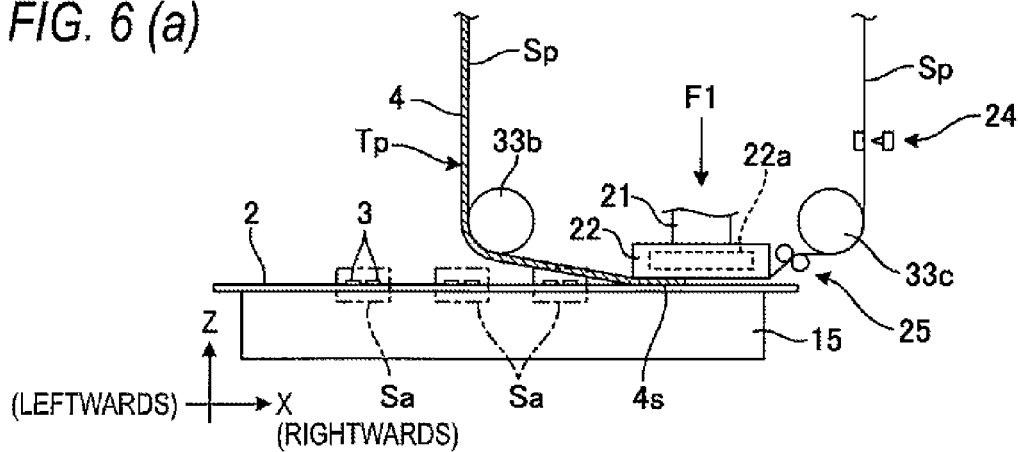
FIGS. 6 (a), (b), and (c) are descriptive operation diagrams of tape adhering operation performed by the tape adhering apparatus of the embodiment of the present invention.
Figure 6:
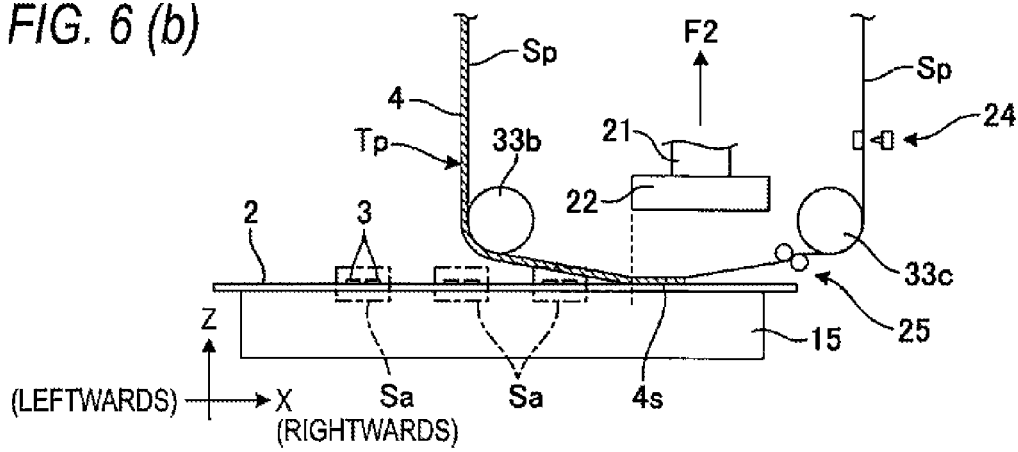
Figure 6:
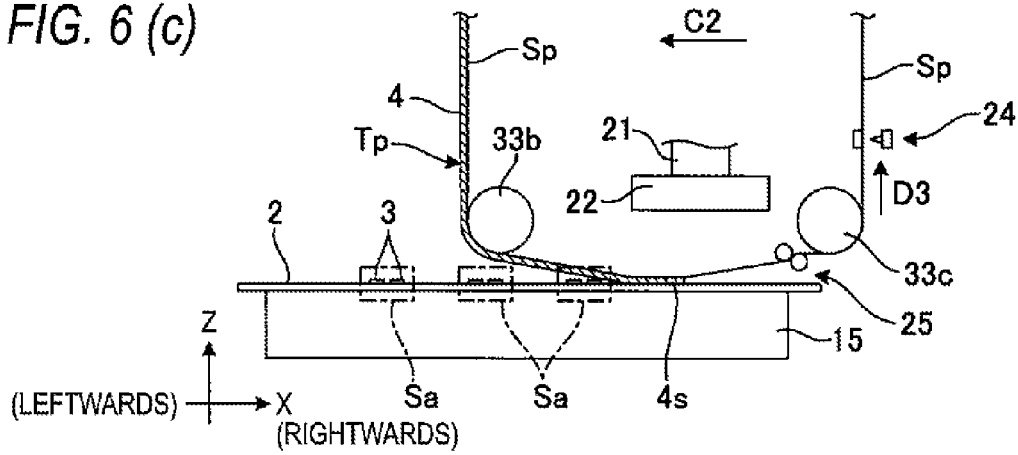
Figure 7:
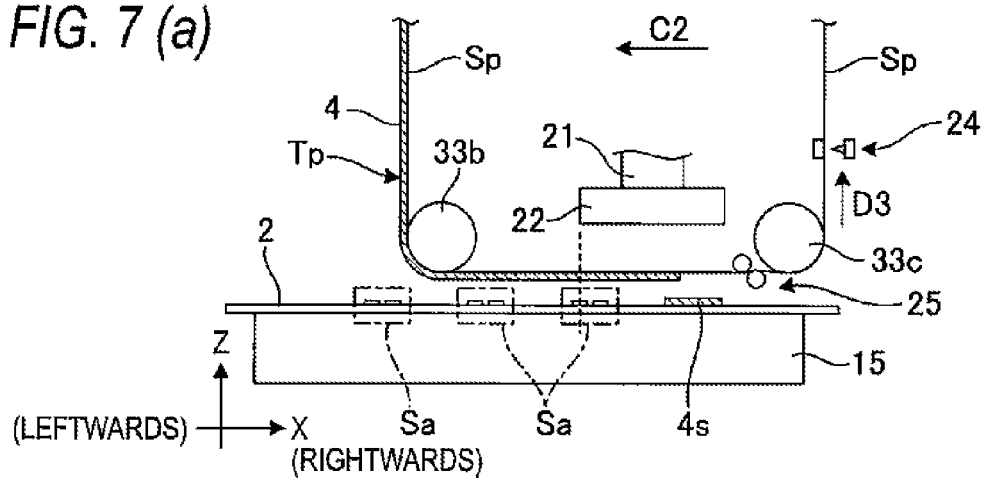
FIGS. 7 (a), (b), and (c) are descriptive operation diagrams of tape adhering operation performed by the tape adhering apparatus of the embodiment of the present invention.
Figure 7:
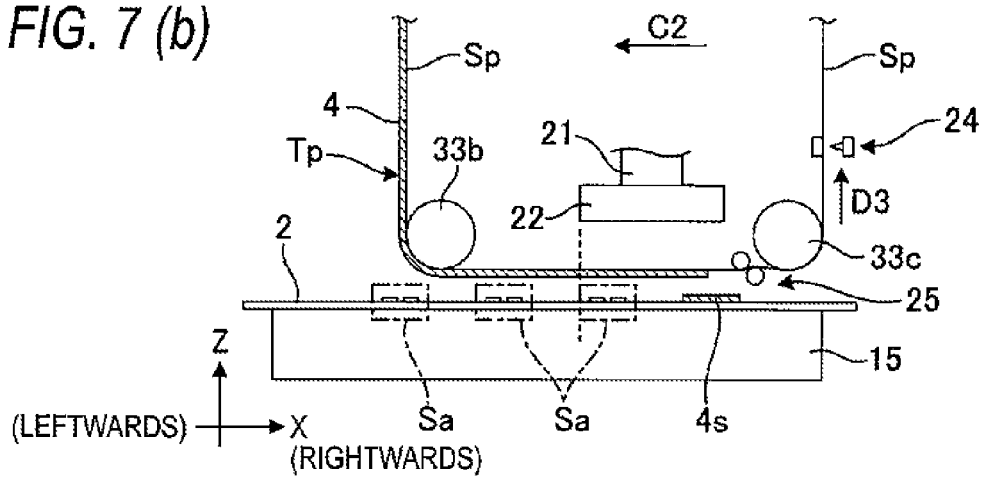
Figure 7:
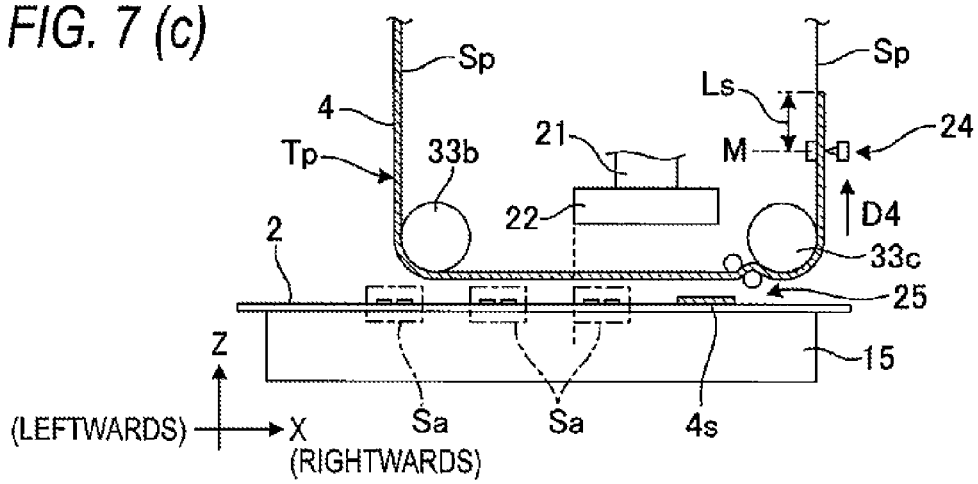

By reference to a flowchart of FIG. 4 and descriptive operation diagrams of FIGS. 5(a) to 7(c), explanations are given to procedures through which the tape adhering apparatus 1 performs operation (tape adhering operation) for adhering the cut piece 4S of the ACF tape 4 to the target adhering area Sa on the substrate 2.

In order to let the tape adhering apparatus 1 adhere the cut piece 4S of the ACF tape 4 to the target adhering area Sa on the substrate 2, the operation performance control unit 40a of the controller 40 first conveys the substrate 2 received from an electrode cleaning device, which is disposed at an upstream position, by an un-illustrated substrate carry-in mechanism, thereby letting the substrate holding unit 12 hold the substrate 2 (a substrate carry-in and holding process pertaining to step ST1 shown in FIG. 4).

The operation performance control unit 40a of the controller 40 lets the substrate holding unit 12 hold the substrate 2 and activates the substrate holding unit transfer mechanism 11 to thus transfer the substrate holding unit 12, thereby bringing a lower surface of an edge of the substrate 2 equipped with the electrodes 3 into contact with an upper surface of the backup stage 15 (see the substrate 2 designated by a dashed line shown in FIG. 2). The substrate 2 is positioned in such a way that the plurality of electrodes 3 are arranged in a direction parallel to the transfer direction of the transfer base 14 (i.e., the X-axis direction) and also come to a position immediately below the press tool 22 (a substrate positioning process pertaining to step ST2 shown in FIG. 4).

When positioning the substrate 2, the operation performance control unit 40a of the controller 40 captures images of positioning marks provided on both ends of the substrate 2 by the imaging camera 26 by moving the transfer base 14 in the right-left direction (the X-axis direction). The operation performance control unit 40a of the controller 40 causes the image recognition unit 40c to recognize acquired image data, thereby checking whether or not a positional displacement exits between the image and the adhere position on the backup state 15 of the substrate 2.

After positioning the substrate 2, the operation performance control unit 40a of the controller 40 controls operation of the transfer base actuation mechanism 41, thereby actuating the transfer base 14 in the right-left direction (designated by arrow C1 shown in FIG. 5(a)). The operation performance control unit 40a of the controller 40 positions the transfer base 14 in such a way that the left end of the press tool 22 comes to a position immediately above the target adhering area Sa on the substrate 2 to which the press tool 22 is now about to adhere the cut piece 4S of the ACF tape 4 from now (FIG. 5(a): a transfer base positioning process pertaining to step ST3 shown in FIG. 4).

After positioning the transfer base 14, the operation performance control unit 40a of the controller 40 controls operation of the tape conveyor unit 23, thereby conveying the tape member Tp in the forward direction (designated by arrow D1 shown in FIG. 5(a)). The operation performance control unit 40a of the controller 40 positions the ACF tape 4 in such a way that the head of the ACF tape 4 comes to a position that is higher than the cutting position M, where the tape cutting unit 24 cuts the ACF tape 4, by a length Ls equivalent to the length of the target adhering area Sa achieved in the X-axis direction (FIG. 5(a): an ACF tape positioning process pertaining to step ST4 shown in FIG. 4).

After positioning the ACE tape 4, the operation performance control unit 40a of the controller 40 controls actuation of the cutter drive cylinder 24b, thereby transferring the cutter 24a in the right-left direction (designated by arrow E shown in FIG. 5(b)) and cutting the ACF tape 4. The operation performance control unit 40a of the controller 40 forms the cut piece 4S of the ACF tape 4 having a length Ls on the separator Sp (FIG. 5(b): an ACF tape cutting process pertaining to step ST5 shown in FIG. 4).

After forming the cut piece 4S of the ACF tape 4 on the separator Sp by cutting the ACF taper 4, the operation performance control unit 40a of the controller 40 controls operation of the tape conveyor unit 23, thereby conveying the tape member Tp in an opposite direction (designated by arrow D2 shown in FIG. 5(c)). The operation performance control unit 40a of the controller 40 sets the cut piece 4S of the ACF tape 4 formed on the separator Sp to a position that is positioned below the press tool 22 and immediately above the target adhering area Sa on the substrate 2 held by the substrate holding unit 12 (FIG. 5(c): an ACF tape cut piece positioning process pertaining to step ST6 shown in FIG. 4).

After positioning the cut piece 4S of the ACF tape 4, the operation performance control unit 40a of the controller 40 controls operation of the tool elevation cylinder 21, to thus lower the press tool 22 to a lowered position (designated by arrow F1 shown in FIG. 6(a)). The operation performance control unit 40a of the controller 40 presses the cut piece 4S of the ACF tape 4 to the edge of the substrate 2 along with the separator Sp by the press tool 22 previously heated by the heater 22a, thereby adhering the cut piece 4S of the ACF tape 4 to the target adhering area Sa on the substrate 2 (FIG. 6(a): an ACF tape cut piece adhering process pertaining to step ST7 shown in FIG. 4).

As mentioned above, in the present embodiment, the tape conveyor unit 23 conveys the tape member Tp in the opposite direction with respect to the tool elevation cylinder 21. The tool elevation cylinder 21 thereby acts as tool elevation means that lowers the press tool 22 while the cut piece 4S of the ACF tape 4 formed on the separator Sp remains situated at the position immediately above the target adhering area Sa on the substrate 2 held by the substrate holding unit 12, to thus adhere the cut piece 4S of the ACF tape 4 to the target adhering area Sa on the substrate 2.

After adhering the cut piece 4S of the ACF tape 4 to the target adhering area Sa on the substrate 2 by use of the press tool 22, the operation performance control unit 40a of the controller 40 controls operation of the tool elevation cylinder 21, thereby elevating the press tool 22 to the elevated position (designated by arrow F2 shown in FIG. 6(b)).

Since the cut piece 4S of the ACF tape 4 remains adhered to the target adhering area Sa on the substrate 2 while the press tool 22 is held at the elevated position, the tape member Tp located between the second guide roller 33b and the third guide roller 33c remains pulled downward as designated by FIG. 6(b).

After raising the press tool 22 to the elevated position, the operation performance control unit 40a of the controller 40 determines if the target adhering area Sa to which the cut piece 4S of the ACF tape 4 is to be adhered still remains on the substrate 2 where adhering of the cut piece 4S of the ACF tape 4 is now being performed (a determination process pertaining to step ST8 shown in FIG. 4). As a consequence, when the target adhering area Sa to which the cut piece 4S of the ACF tape 4 is to be adhered still remains on the substrate 2, the operation performance control unit 40a of the controller 40 controls operation of the transfer base actuation mechanism 41. The operation performance control unit 40a of the controller 40 transfers the transfer base 14 leftwards (as designated by arrow C2 shown in FIG. 6(c), FIG. 7(a), and FIG. 7(b)), thereby positioning the transfer base 14 in such a way that the left end of the press tool 22 comes to a position immediately above the left end of the target adhering area Sa on the substrate 2 to which the press tool is now (about to) adhere the cut piece 4S of the ACF tape 4 (FIG. 7(b)). In the meantime, operation of the tape conveyor unit 23 is controlled, thereby conveying the tape member Tp in the forward direction (as designated by arrow D3 shown in FIG. 6(c), FIG. 7(a), and FIG. 7(b)). The separator Sp adhered to the upper surface of the cut piece 4S of the ACF tape 4 affixed onto the substrate 2 is conveyed by the tape conveyor unit 23 while being pulled upward by the peeling rollers 25. Therefore, the separator Sp is separated from the cut piece 4S of the ACF tape 4 adhered to the target adhering area Sa on the substrate 2 (in sequences shown in FIGS. 6(b), 6(c), and 7(a): a transfer base positioning process doubling as a separator peeling process pertaining to step ST9 shown in FIG. 4).

In the embodiment, the transfer base actuation mechanism 41 acts as transfer base actuation means. The transfer base actuation means moves the transfer base 14 with respect to the substrate holding unit 12 in a direction opposite to the direction in which the tape member Tp is forwardly conveyed in the region Rg immediately below the press tool 22 in such way that the press tool 22 comes to a position above the target adhering area Sa on the substrate 2 to which the cut piece 4S of the ACF tape 4 is next adhered after the cut piece 4S of the ACF tape 4 is pressed against and adhered to the target adhering area Sa on the substrate 2 by the press tool 22.

After positioning of the transfer base 14 that doubles as peeling of the separator Sp is performed, the operation performance control unit 40a of the controller 40 lets the tape conveyor unit 23 keep conveying the tape member Tp in the forward direction even after peeling of the separator Sp is completed (designated by arrow D4 shown in FIG. 7(c): a tape member conveyance continuation process pertaining to step ST10 shown in FIG. 4). Turning back to step ST4, the ACF tape 4 is positioned in such a way that the head of the ACF tape 4 comes to an elevated position above the cutting position M where the tape cutting unit 24 cuts the ACF tape 4, by a length Ls equivalent to the length of the target adhering area Sa in the X-axis direction (FIG. 7(c)).

In the meantime, when the target adhering area Sa where the cut piece 4S of the ACF tape 4 is to be adhered is not present on the substrate 2 in step ST8, the operation performance control unit 40a of the controller 40 causes the tape conveyor unit 23 to convey the tape member Tp in the forward direction while actuating the transfer base 14 leftwards. The operation performance control unit 40a of the controller 40 thereby peels the separator Sp from the cut piece 4S of the ACF tape 4 adhered to the target adhering area Sa on the substrate 2 (a separator peeling process pertaining to step ST11 shown in FIG. 4). In step ST10, the operation performance control unit 40a of the controller 40 transfers the transfer base 14 by an amount of travel that is enough to allow peeling of the separator Sp.

After peeling the separator Sp in step ST11, the operation performance control unit 40a of the controller 40 conveys, to the tentative pressure bonder disposed at a downstream position, the substrate 2 held by the substrate holding unit 12 (i.e., the substrate 2 to which the cut piece 4S of the ACF tape 4 has finished being adhered) by use of an un-illustrated substrate carry-out mechanism (a substrate carry-out step pertaining to step ST12 shown in FIG. 4).

As mentioned above, a tape adhering method performed by the tape adhering apparatus 1 of the present embodiment includes processes (1) to (5). Process (1) (an ACF tape cutting process pertaining to step ST5) is for cutting the ACF tape 4 from the tape member Tp conveyed by the tape conveyor unit 23, by the tape cutting unit 24 disposed downstream of the region Rg, immediately below the press tool 22, of the tape member Tp conveyed by the tape conveyor unit 23 with respect to the forward conveyance direction of the tape member Tp, to thus form the cut piece 4S of the ACF tape 4 on the separator Sp. Process (2) (an ACF tape cut piece positioning process pertaining to step ST6) is for conveying the tape member Tp in the reverse direction by the tape conveyor unit 23, thereby placing the cut piece 4S of the ACF tape 4 formed on the separator Sp at a position immediately above the target adhering area Sa on the substrate 2 held by the substrate holding unit 12. Process (3) (an ACF tape cut piece adhering process pertaining to step ST7) is for lowering the press tool 22 while the cut piece 4S of the ACF tape 4 formed on the separator Sp is kept positioned immediately above the target adhering area Sa on the substrate 2, thereby pressing the cut piece 4S of the ACF tape 4 against the target adhering area Sa on the substrate 2 and adhering the cut piece 4S of the ACF tape 4 to the target adhering area Sa. Process (4) (a transfer base positioning process doubling as a separator peeling process pertaining to step ST9) is for subsequently transferring the transfer base 14 in a direction opposite to the forward conveyance direction of the tape member Tp, which is achieved in the region Rg immediately below the press tool 22, with respect to the substrate holding unit 12 in such a way that the press tool 22 comes to a position above the target adhering area Sa on the substrate 2 to which the cut piece 4S of the ACF tape 4 is to be adhered after the cut piece 4S of the ACE tape 4 is adhered to the target adhering area Sa on the substrate 2 by the press tool 22, and letting the tape conveyor unit 23 convey the tape member Tp in synchronism with transfer action of the transfer base 14 (therefore, in synchronism with transfer of the peeling rollers 25 toward the cut piece 4S of the ACF tape 4 adhered onto the substrate 2), to thus peel the separator Sp from the cut piece 4S of the ACF tape 4 adhered to the target adhering area Sa on the substrate 2. Process (5) (an ACF tape positioning process pertaining to step ST4) is for peeling the separator Sp from the cut piece 4S of the ACF tape 4 and letting the tape conveyor unit 23 continually convey the tape member Tp in the forward conveyance direction, thereby placing a cut portion of the ACF tape 4 to be next adhered at the cutting position M of the tape cutting unit 24.

As mentioned above, in the tape adhering apparatus 1 of the embodiment, the tape cutting unit 24 is disposed downstream of the region Rg of, immediately below the press tool 22, the tape member Tp conveyed by the tape conveyor unit with respect to the forward transfer direction of the tape member. After the cut piece 4S of the ACF tape 4 is pressed and adhered to the target adhering area Sa on the substrate 2 by the press tool 22, the transfer base actuation mechanism 41 actuates the transfer base 14. The tape member Tp is conveyed in the forward direction in synchronism with actuation of the transfer base 14.

In the tape adhering apparatus 1 (the tape adhering method) of the present embodiment, the press tool 22 presses and adheres the cut piece 4S of the ACF tape 4 against and to the target adhering area Sa on the substrate 2. Subsequently, the tape member Tp is forwardly conveyed in synchronism with actuation of the transfer base 14 in such a way that the press tool 22 comes to an elevated position above the target adhering area Sa on the substrate 2 to which the cut piece 4S of the ACF tape 4 is to be adhered, thereby peeling the separator Sp from the cut piece 4S of the ACF tape 4. There are simultaneously performed processing pertaining to the process of peeling the separator Sp from the cut piece 4S of the ACF tape 4 adhered to the target adhering area Sa on the substrate 2 and processing pertaining to the process of subsequently placing the press tool 22 at an elevated position above the target adhering area Sa on the substrate 2 to which the cut piece 4S of the ACF tape 4 is to be adhered. Hence, a necessity for additionally providing transfer rollers for peeling the separator Sp and reciprocally actuating the transfer rollers, such as that required in the related art, becomes obviated. Further, a time consumed by operation for adhering one cut piece of the ACF tape 4 can be shortened.

The tape cutting unit 24 is disposed downstream of the region Rg of the tape member Tp, immediately below the press tool 22, conveyed by the tape conveyor unit 23 with respect to the forward transfer direction of the tape member Tp. Hence, occurrence of interference with the press tool 22, which would otherwise arise when the cut piece 4S of the ACF tape 4 is pressed against the substrate 2, is prevented. Therefore, a necessity for a configuration that allows advancement and receding of the tape cutting unit 24 becomes obviated. The mechanism of the tape adhering apparatus therefore becomes simple. Further, the time consumed by letting the tape cutting unit 24 advance and recede every time the ACE tape 4 is cut is omitted. Hence, the time consumed by operation for adhering one cut piece 4S of the ACF tape 4 can be shortened even in view of this aspect. Since positioning of a cut position of the ACF tape 4 can be performed by carrying out, without involvement of a change and interruption, forward conveyance of the tape member Tp for peeling the separator Sp, a work time will not increase when compared with the case where the cut position of the ACF tape 4 of the tape member Tp is positioned at a cutting position immediately below the press tool 22 and where the tape cutting means is caused to advance to cut the ACF tape 4, such as those performed in the related art.

Although the embodiment of the present invention has been described thus far, the present invention is not limited to the previously-described embodiment. For instance, the tape cutting unit 24 of the embodiment is configured so as to cut the ACF tape 4 by pressing the cutter 24a, which travels in a horizontal direction, at right angles against the surface of the ACF tape 4. Instead, the tape cutting unit 24 may also be configured so as to have a rotary blade that rotates around an axis parallel to the direction of extension of the tape member Tp and to let the rotary blade rotating in a widthwise direction of the tape member Tp run on the ACF tape 4, thereby cutting the ACF tape 4.

The essential requirement is that the tape cutting unit 24 be disposed downstream of the region Rg, immediately below the press tool 22, of the tape member Tp conveyed by the tape conveyor unit 23, with respect to the forward conveyance direction of the tape member Tp with respect to located immediately below the press tool 22. No specific limitation are imposed on the location of the tape cutting unit 24.

Although the present invention has been described in detail by reference to the specific embodiment, it is manifest to those skilled in the art that the present invention be susceptible to various alterations or modifications without departing the spirit and scope of the present invention.

The present patent application is based on Japanese Patent Application (JP-2010-254688) filed on Nov. 15, 2010, the entire subject matter of which is incorporated herein by reference.

INDUSTRIAL APPLICABILITY

There are provided a tape adhering apparatus and a tape adhering method that enable shortening of a time consumed to perform operation for adhering one cut piece of an ACF tape.

DESCRIPTIONS OF THE REFERENCE NUMERALS AND SYMBOLS

1 TAPE ADHERING APPARATUS
2 SUBSTRATE
3 ELECTRODE
4 ACF TAPE
4S CUT PIECE
10 BASE
11 SUBSTRATE HOLDING UNIT TRANSFER MECHANISM
11a X-AXIS TABLE
11b Y-AXIS TABLE
11c Z-AXIS TABLE
12 SUBSTRATE HOLDING UNIT
13 PORTAL FRAME
13a TRANSVERSE FRAME
14 TRANSFER BASE
14a ROLLER TRANSFER GROOVE
15 BACKUP STAGE
21 TOOL ELEVATION CYLINDER (TOOL ELEVATION MEANS)
21a PISTON ROD
22 PRESS TOOL
22a HEATER
23 TAPE CONVEYOR UNIT (TAPE CONVEYOR MEANS)
24 TAPE CUTTING UNIT (TAPE CUTTING MEANS)
24a CUTTER
24b CUTTER DRIVE CYLINDER
24c BACKBOARD
25 PEELING ROLLER
26 IMAGING CAMERA
31 FEED REEL
31a FEED REEL DRIVE MOTOR
32 TAPE RECOVERY UNIT
32a TAPE RECOVERY UNIT ACTUATION MECHANISM
33a TO 33d FIRST THROUGH FOURTH GUIDE ROLLERS
40 CONTROLLER
40a OPERATION PERFORMANCE CONTROL UNIT
40b IMAGE DATA STORAGE UNIT
40c IMAGE RECOGNITION UNIT
41 TRANSFER BASE ACTUATION MECHANISM (TRANSFER BASE ACTUATION MEANS)
42 SUBSTRATE HOLDING UNIT ACTUATION MECHANISM
43 ROTATION NUMBER DETECTION SENSOR
44 HEATER ACTIVATION MECHANISM
M CUTTING POSITION
Sp SEPARATOR
Tp TAPE MEMBER
Rg REGION LOCATED IMMEDIATELY BELOW PRESS TOOL
Sa TARGET ADHERING AREA

The invention claimed is:

1. A tape adhering apparatus comprising:
a substrate holding unit that holds a substrate;
a transfer base that is movable in a horizontal direction;
a press tool disposed so as to be able to ascend or descend with respect to the transfer base;
a tape conveyor means that is disposed on the transfer base and that transfers a tape member, which is formed by putting a separator on one side of an ACF tape made up of an anisotropic conductive film, in a forward or backward direction along a direction parallel to a transfer direction of the transfer base in a region immediately below the press tool;
a tape cutting means that is disposed at a portion that is along the tape member conveyed by the tape conveyor means and that is located at a downstream side from the region immediately below the press tool, with respect to the forward transfer direction of the tape member conveyed by the tape conveyor means and that cuts the ACF tape from the tape member conveyed by the tape conveyor means, thereby forming a cut piece of the ACF tape on the separator;

a tool elevation means that lowers the press tool while positioned at a location immediately above a target adhering area on the substrate, where a cut piece of the ACF tape formed on the separator is held by the substrate holding unit, as a result of the tape member being conveyed in a reverse direction by the tape conveyor means, thereby pressing the cut piece of the ACF tape to the target adhering area on the substrate and adhering the cut piece of the ACF tape to the target adhering area on the substrate; and a transfer base actuation means that subsequently transfers the transfer base with respect to the substrate holding unit in a direction opposite to the forward transfer direction of the tape member in the region immediately below the press tool in such a way that the press tool comes to an elevated position above the target adhering area on the substrate where the cut piece of the ACF tape is adhered after the cut piece of the ACF tape is pressed against and adhered to the target adhering area on the substrate by the press tool, wherein the tape conveyor means forwardly conveys the tape member in synchronism with actuation of the transfer base performed by the transfer base actuation means, thereby peeling the separator off from the cut piece of the ACF tape adhered to the target adhering area on the substrate, and further keeps conveying the tape member forwards, to thus place a cut portion of the ACF tape to be adhered next to the cutting position of the tape cutting means.

2. A tape adhering method for a tape adhering apparatus including a substrate holding unit that holds a substrate, a transfer base that is movable in a horizontal direction; a press tool disposed so as to be able to ascend or descend with respect to the transfer base, a tape conveyor means that is disposed on the transfer base and that transfers a tape member, which is formed by putting a separator on one side of an ACF tape made up of an anisotropic conductive film, in a forward or backward direction along a direction parallel to a transfer direction of the transfer base in a region immediately below the press tool; and tape cutting means that is disposed at a portion that is along the tape member conveyed by the tape conveyor means and that is located at a downstream side from the region immediately below the press tool, with respect to the forward transfer direction of the tape member conveyed by the tape conveyor means and that cuts the ACF tape from the tape member conveyed by the tape conveyor means, thereby forming a cut piece of the ACF tape on the separator, the method comprising:

a process of cutting, by use of the tape cutting means, the ACE tape from the tape member conveyed by the tape conveyor means, thereby forming a cut piece of the ACF tape on the separator;

a process of conveying the tape member in the reverse direction by the tape conveyor means, thereby placing the cut piece of the ACF tape formed on the separator at a position immediately above a target adhering area on the substrate held by the substrate holding unit;

a process of lowering the press tool while the cut piece of the ACF tape formed on the separator is kept positioned immediately above the target adhering area on the substrate, thereby pressing the cut piece of the ACF tape against the target adhering area on the substrate and adhering the cut piece of the ACF tape to the target adhering area on the substrate;

a process of subsequently transferring the transfer base in a direction opposite to the forward transfer direction of the tape member achieved in the region immediately below the press tool and with respect to the substrate holding unit in such a way that the press tool comes to a position above the target adhering area on the substrate to which the cut piece of the ACF tape is to be adhered after the cut piece of the ACF tape is pressed against and adhered to the target adhering area on the substrate by the press tool, and letting the tape conveyor means forwardly convey the tape member in synchronism with transfer action of the transfer base, to thus peel the separator from the cut piece of the ACF tape adhered to the target adhering area on the substrate; and a process of peeling the separator from the cut piece of the ACF tape and letting the tape conveyor means continually convey the tape member in the forward conveyance direction, thereby placing a cut portion of the ACF tape to be next adhered at the cutting position of the tape cutting means.

* * * * *